United States Patent [19]

Whitehouse et al.

[11] Patent Number: 4,546,249
[45] Date of Patent: Oct. 8, 1985

[54] HIGH SPEED OPTICALLY CONTROLLED SAMPLING SYSTEM

[75] Inventors: Harper J. Whitehouse; William H. McKnight, both of San Diego, Calif.

[73] Assignee: The United States of America as represented by the Secretary of the Navy, Washington, D.C.

[21] Appl. No.: 510,016

[22] Filed: Jul. 1, 1983

[51] Int. Cl.⁴ .............................................. G02B 5/14
[52] U.S. Cl. .................................... 250/227; 455/610
[58] Field of Search ............... 358/901; 250/227, 551; 455/610, 612; 324/77 H, 77 K; 350/96.13, 96.14, 96.15, 96.16

[56] References Cited

U.S. PATENT DOCUMENTS

| | | | |
|---|---|---|---|
| 3,838,278 | 9/1974 | Duguay et al. | 455/612 |
| 3,925,725 | 12/1975 | Duguay | 250/227 |
| 4,164,373 | 8/1979 | Schuss et al. | 250/227 |
| 4,427,895 | 1/1984 | Eng | 455/610 |

*Primary Examiner*—David C. Nelms
*Attorney, Agent, or Firm*—Robert F. Beers; Ervin F. Johnston; Thomas Glenn Keough

[57] ABSTRACT

A number of high frequency signal sources such as a number of receiving antennas have their information content extracted by an optoelectronic synchronous sampling system. A laser provides pulses of proper frequency and duration and feeds them to a fiberoptic bundle. In one embodiment the fibers are lengthened to be simultaneously actuated. Otherwise, each of the fibers in the bundle has a different length so that light emanating from their distal ends appears as a delayed series of actuating light pulses. Phase shifters, pressure or electric field effects, can effect delay and consequent beamforming. Optoelectronic switches are disposed adjacent the distal ends so that the delayed series of actuating pulses actuates the switches in a synchronous sequence to synchronously sample the high frequency signals received by each of the antennas. Interconnected analog-to-digtal and processing circuitry conditions the synchronously received samples for further use. The discrete delays assured by the different lengths of the optical fibers and the optoelectronic switches enable responsive synchronous sampling of the number of high frequency sources to extract their information content. There is no EMI or RFI, neither does it generate them. This can effectively operate in a high noise environment.

14 Claims, 5 Drawing Figures

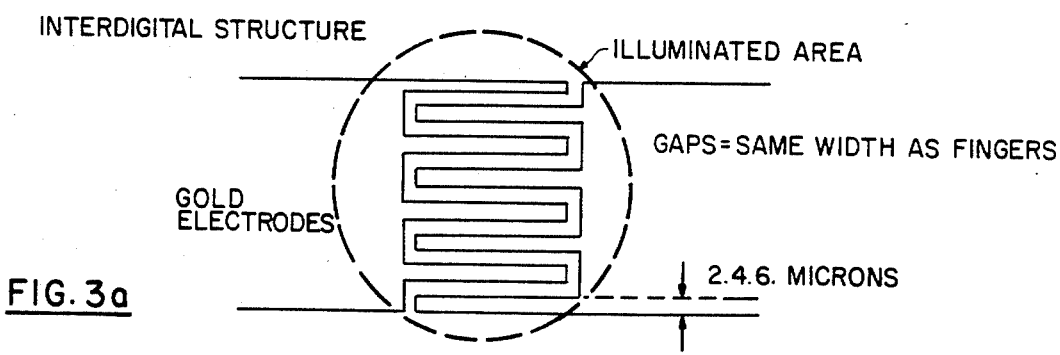
FIG. 3a
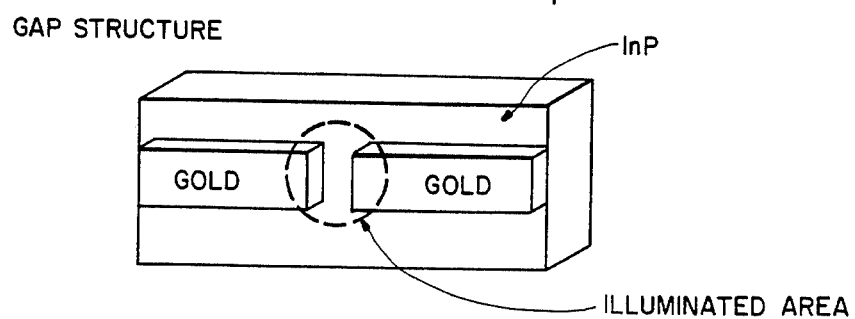
FIG. 3b
| Photoconductive lifetime (psec) | 1000 | 50 | 10 | 1 |
|---|---|---|---|---|
| Maximum Operating Frequency (GHz) | 0.16 | 3.2 | 16 | 160 |
| Minimum Feature Size $\ell$ ($\mu$m) | 2 | 1 | 0.5 | 0.25 |
| Capacitance (fF) | 5 | 10 | 20 | 40 |
| On-State Resistance (ohm) for $\omega = 0.1\omega_c$ | $20 \times 10^3$ | 500 | 50 | 2.5 |
| Required Laser Power (mW) | 0.0015 | 0.3 | 3.75 | 188 |
Device area = $20 \times 20\ \mu m^2$
Electron mobility = $4000\ cm^2/V\text{-sec}$
FIG. 4

HIGH SPEED OPTICALLY CONTROLLED SAMPLING SYSTEM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Many radio receiving systems continue to operate using analog technology developed over three decades ago. Although performing somewhat satisfactorily for the demands imposed upon it at the time, limitations are apparent, particularly with respect to present day applications. The most apparent of these limitations are evident in a limited dynamic range, imprecision and difficulty in applying new beamforming and direction finding algorithms, electronic noise and jammer vulnerability, etc.

One application where the state-of-the-art technology is noticeably inadequate is in a multielement radio receiving array, more commonly known as a high frequency directional finding system. This system, although acceptable in its time, could greatly benefit from a conversion to digital processing technology. Multielement phased receiver arrays have other special signal processing problems in that the phase relationships between the signals received at each element must be measured and preserved with considerable stability and accuracy in order to permit the beamforming, direction finding, etc. operations to be performed. Often the signals of interest are found to be as much as 120–140 dB weaker than noise and jamming signals. In this context it is not difficult to perceive that a conversion to digital signal processing is desirable to obtain and preserve 20–24 bits of dynamic range in the received signals to assure detection and processing of the signals of interest.

The current state-of-the-art for speed and accuracy in analog-to-digital converters is on the order of eight bits at 75 megasamples per second or six bits at 100 megasamples per second for commercial devices. However, in most analog-to-digital systems the sample and hold function is critical since aperture time and jitter can limit the performance of the entire digitizing system. The speed and dynamic range available for digitizing the radio frequency spectrum in some phased array applications is clearly inadequate, especially when considering that it is generally preferable to digitize prior to sub-banding, mixing, detecting, etc. since the analog processes and associated components are typically incapable of linearity throughout the extremely wide dynamic range spanning 120–140 decibels if necessary.

In addition, for a system that will provide the digitizing of a number of high frequency digital sources to extract their information, the mechanism for having an appropriate speed and dynamic range is needed. Such a system must also address all the phase requirements associated with signal processing for such receiver arrays. Currently the state-of-the-art fails to provide a switching and sampling arrangement having the precisely measured synchronism to accommodate a number of high frequency signal sources to allow the meaningful extraction of the information.

Thus, there is a continuing need in the state-of-the-art for a high speed synchronous sampling of several high frequency sources that is fast and accurate enough to enable the extraction of information without the introduction of errors which would compromise the linearity of the information content.

SUMMARY OF THE INVENTION

The present invention is directed to providing an apparatus for enabling the high speed synchronous sampling of signals from a plurality of signal sources. A means for providing light pulses at a rate equal to the high speed sampling feeds light pulses to a fiber optic bundle that creates a delayed series of actuating light pulses due to the differently lengthed fibers in the bundle. Optionally, means could be provided to alter the light propogation rate in the fibers such as pressure or electric field to effect the delayed series. Optoelectronic switches are operatively associated with each of the fibers to sample each of the signal sources at the synchronous sampling rate and in the same synchronous sequence as the series of actuating pulses. Analog-to-digital and further processing circuitry coupled to receive the sampled signals allow further processing.

A prime object of the invention is to provide a means for enabling the sampling of a number of signal sources to extract their information content.

Another object of the invention is to provide an apparatus for responsively sampling a number of high frequency signal sources without compromising the information content therein.

Still another object of the invention is to provide a high speed synchronous sampling of a number of high frequency sources by optoelectronic means.

Still a further object is to provide an apparatus including a number of optical fibers which may have different lengths to carry a series of actuating light pulses to assure a synchronous sampling of a number of high frequency signal sources.

Yet a further object of the invention is to provide a plurality of optoelectronic switches each operatively associated with a separate high frequency signal source that is actuated by a light pulse carried by a discrete optical fiber to assure a synchronous sampling.

Another object is to provide an apparatus relying upon optoelectronic actuation and sampling to preserve the linearity of the signals from a number of high frequency sources.

A further object is to provide an apparatus for synchronously sampling a number of high frequency signal sources reducing the level of electronic noise normally associated with such an operation.

Yet another object is to provide a high speed synchronous sampling system fabricated to minimize shielding and other expedients for controlling interference.

Still another object of the invention is to provide a synchronous scanning system having advantages in speed, accuracy and dynamic range compared to conventional systems.

Another object is to provide a synchronous scanning system having reduced pulse jitter and pulse width features to allow the sampling of a number of signal sources simultaneously or with fixed phase and time relationships to perform beamforming, direction finding, correlations, convolutions, etc. digitally.

Still another object is to provide a synchronous sampling apparatus having improved stability, reduced intermodulation product sensitivity, minimal pulse spreading, limited drift, diminished sampling, mis-timing, and improved sampling coincidence.

Yet a further object is to provide a synchronous scanning apparatus having increased freedom from electronic noise interference such as from unwanted feedback, reflection, inductive pick ups, stray capacitances, RFI, EMI, etc.

Yet another object of the invention is to provide an optically controlled technique having precision and stability in interelement phase relationships which is readily achieved by locating a single sampling control laser such that the length of each optical fiber to each sampling switch positioned at each high frequency antenna array element can be selected to determine the desired sampling phase relationship.

These and other objects of the invention will become more readily apparent from the ensuing specification and claims when taken with the appended drawings.

BRIEF DESCRIPTION OF THE DRAWINGS

FIGS. 3a and 3b depict the structure of the optically controlled switches showing an interdigital electrode structure and an end-to-end electrode structure.

FIG. 4 depicts performance of an impedance-matched indium phosphide optoelectronic switching device.

DESCRIPTION OF THE PREFERRED EMBODIMENTS

Figure 1:
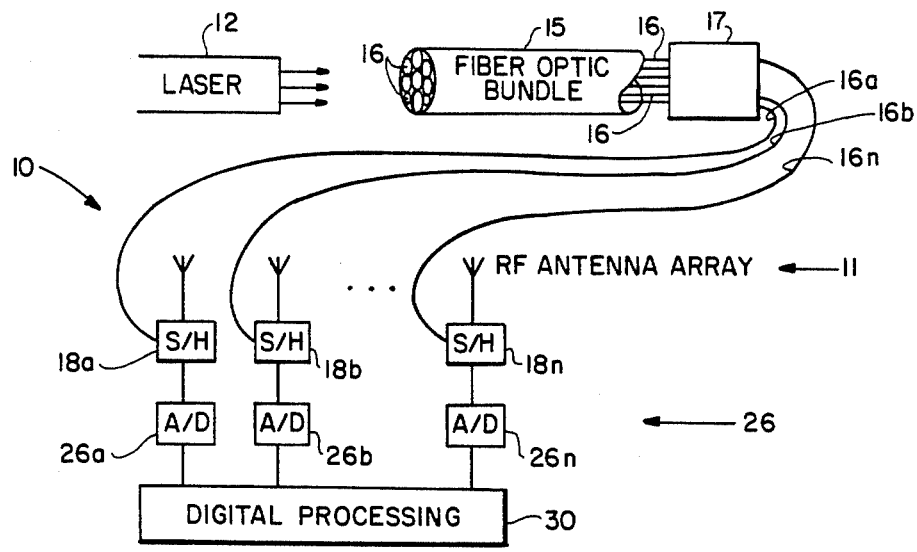
FIG. 1 is a schematical representation of the principal constituents of this inventive concept.

Referring now to the drawings and in particular FIG. 1, a high speed sampling system 10 is particularly adaptable to perform a synchronous sampling of a multiple signal source such as a radio frequency antenna array 11. Typically, such an antenna array could be an arrangement of antennas functioning as a high frequency directional finding (HFDF) system. The plurality of signals delivered by each antenna in the array, possibly having frequencies of interest in the 3-30 megahertz range, have a vast information content that needs a fast repetitive sampling, and, consequently, a precise, distortion-free rapid switching to prevent information loss. Therefore, the high switching capabilities, precision and freedom from electronic noise makes an optoelectric switching approach highly desirable.

A mode locked ion-krypton or other suitable laser 12, such as a model 164 by Spectra Physics of Mountain View, Calif. has been selected to provide a series of sampling pulses which assures a responsive sampling rate for the system. The pulse length of the laser output determines the sampling window width for all of the antennas to be sampled and the laser pulse repetition rate corresponds to the sampling rate for all the antennas or other suitable signal sources to be sampled. Typical values for a mode locked ion-krypton laser would be a pulse length of about $100-250 \times 10^{-12}$ seconds at a frequency or sampling rate of $150 \times 10^6$ Hz. The laser selected was converted to ion-krypton from ion-argon to produce stronger lines in the red and near infrared wavelengths in order to be more compatible with the optical fibers in a fiberoptic bundle 15. The bundle was located to have one end disposed to receive the pulses from the laser. Individual fibers 16 within the bundle are selected from a wide variety of such fibers currently available and have a typical pulse spreading within a 100 meter typical length of a common single mode optical fiber in the order of 10-20 picoseconds. An off-the-shelf multimode fiber typically features pulse spreading on the order of 100-200 picoseconds over the 100 meter typical length. There is a current effort to measure the pulse timing error (pulse jitter) which needs to be held to less than $0.05 F_n$, where $F_n$ is the Nyquist sampling range. If $F_n$ approximately equals 100 megahertz, the timing uncertainty equals approximately $200 \times 10^{-9}$ seconds. Another consideration is that the arrangement of the bundle of optical fibers is such as to ensure that "equal" amounts of optical power from the laser are delivered to each fiber in a bundle. Appropriate positioning of the bundle and focussing devices, such as lenses are included to assure an "equal" proper coupling and would be selected from a wide variety of suitable designs by one skilled in the art to which this invention pertains.

The length $16a$, $16b$, ... $16n$ of each fiber 16 of bundle 15 is selected to provide a synchronous sequence of light actuating pulses at their distal end; that is to say, the length of each fiber relative to the lengths of the other fibers may be different and is selected to give the proper phase and time relationship among the various antenna array elements for implementation of appropriate algorithms such as beamforming, etc.

To repeat, an essential feature of this inventive concept is the precision and stability in interelement phase relationships and insensitivity to interfering electronic noise which is achieved by locating a single control laser 12 and the discrete lengths of a number of optical fibers where they extend to each of the antenna elements are selected to determine the desired sampling phase relationship. A representative light propogation speed in optical fibers yields approximately two centimeters for every 100 picoseconds of time delay. The extent of signal sampling generation of and simultaneity, insensitivity to interfering and unwatned electronic noise, and absence of interelement drift and mis-timing is quite precise with this system.

The lengths of the fibers involved can be selectively varied or maintained equal to arrive at the desired phase relationships among the signals received by the antennas of the array. Beamforming and directivity, for example, optionally could be provided for within the scope of the present inventive concept by merely including an optical selector switch in block 17 or suitable disconnects in each optical fiber. Reconnection of the disconnects or the addition of fibers of different lengths could be made to change the phase relationships among the scanned signals of the array. Care must be exercised in the selection of the optical selector switch and the disconnects to preserve the phase relationships, durations, etc. of the transmit optical pulses. Entire bundles of differently lengthened fibers may be substituted one for the other when a particular algorithm is to be implemented. Pressure or electric field impressing devices and circuits that change the light propogating speed could be substituted in block 17 to provide for the properly delayed optical pulses to be fed to the switches.

Figure 2:
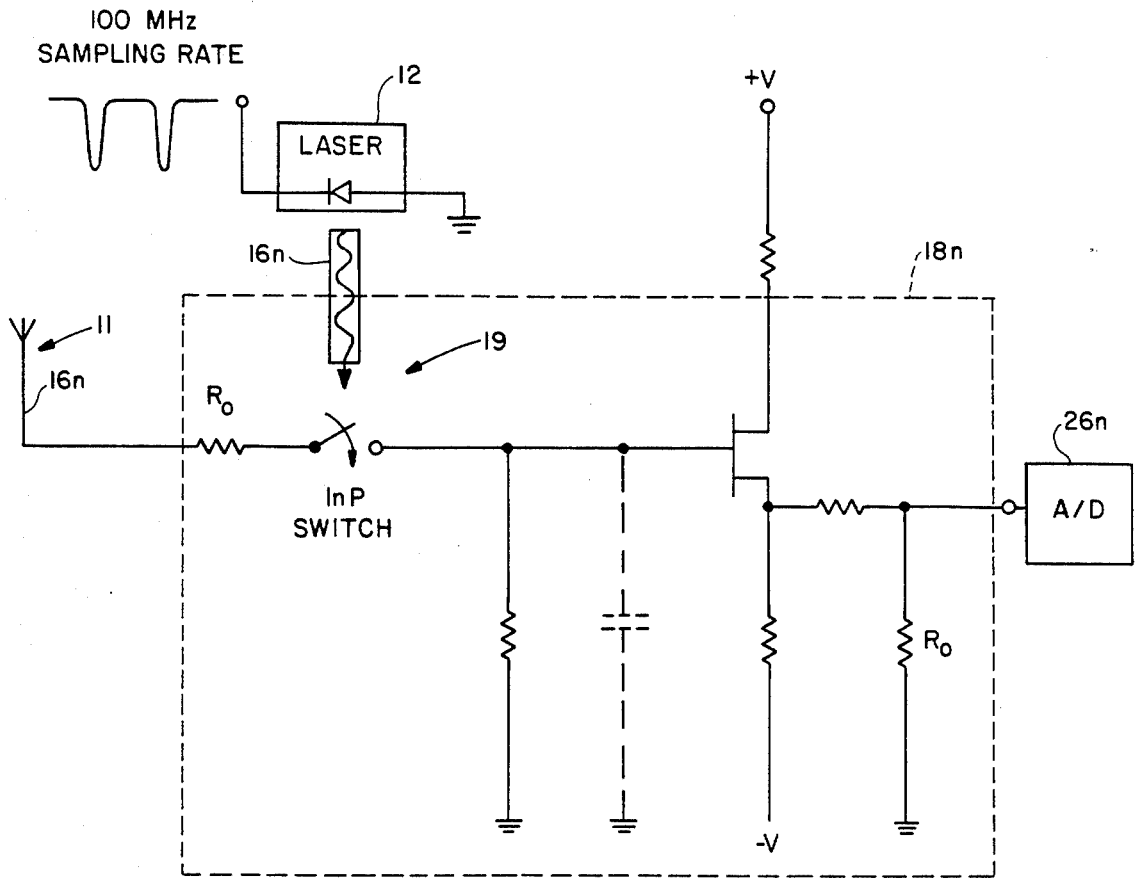
FIG. 2 shows a circuit diagram of a typical sample and hold circu;itincluding an optoelectronic switch.

The distal ends of the fibers extend to sample and hold circuits $18a$, $18b$, ... $18n$ where the ends are each disposed adjacent an optoelectronic switch 19. A sample and hold circuit is interposed between a RF antenna of array 11 and an analog-to-digital converter $26a$, $26b$, ... $26n$ which feeds representative digital signal to further digital processing circuitry 30. FIG. 2 shows a representative sample and hold circuit 18n actuated via fiber 16n by laser 12.

A typical optoelectronic switch can be an indium phosphide switch which exhibits a high electrical resistance in the megohm range when unilluminated and depending upon the switch architecture and other parameters. This same switch typically has a low resistance, for example, about 17 ohms at 6 milliwatts (He-Ne laser) when it is illuminated. The speed of response and relaxation easily permits laser pulse widths on the order of 100 picoseconds to be followed. Thus, a sample and hold system could utilize a suitable mode-locked laser 12 such as that discussed, to generate a train of short optical sampling pulses which would be fanned out via the fiberoptic bundle to optoelectronic switches located at each antenna. Each pulse would actuate an optoelectronic switch to define a sampling window during which each antenna element would offer a signal sample. The optoelectronic switch included with a precision sample and hold circuitry, note FIG. 3 as an example, that would provide an input to an A-to-D converter 26n. The magnitudes of the bias potentials, resistors, optional capacitor and field effect transistor to preserve the sampled signal are apparent to one skilled in the art and further discussion is not felt to be necessary to avoid belaboring the obvious.

Several high speed optoelectronic switches have been developed for analog signal processing applications employing chromium-doped gallium arsenide, amorphous silicon and iron doped indium phosphides. The optoelectronic switches 19 suitable for inclusion in each sample and hold circuit 18 first were demonstrated in silicon by D. H. Austin in his article entitled "Picosecond Optoelectronics Switching and Gating in Silicon," Applied Physics Letters, Vol. 26, No. 3, Feb. 1, 1975 and R. Castagne et al in their paper entitled "Picosecond One Wavelength Optoelectronic Gate" appearing in Electronics Letters 19 August 1976, Vol. 12, No. 17. At about the same time, R. A. Lawton and A. Scovannec demonstrated the feasibility of a gallium arsenide optically gated switch, Feb. 20, 1975, Vol. 11, No. 4.

An interdigital metal electrode heterostructure on the surface of chromium doped gallium arsenide substrate photoconductor has shown fifty to sixty picosecond rise and decay times. Such a device has been fabricated and reported by C. W. Slayman and L. Figueroa in their paper entitled "Frequency and Pulse Response of a Novel High Speed, Interdigital Surface Photoconductor (IDPC)" in IEEE Electronic Device Letters, EDL-2, 112, (1981) and in their article entitled "A Novel Heterostructure Interdigital Photodetector with Picosecond Optical Response" appearing in IEEE Electronic Device Letters, EDL-2, 208. These devices possess a natural passivating layer and a planar structure making easy compatibility for integration with gallium arsenide MESFET's.

The suitability of the silicon and gallium arsenide structures has been proven to have measured rise and fall times of 45 picoseconds in P-type indium gallium arsenide with a gap of fifteen microns and response to 1.7 micron excitation, see the article by J. Deganey et al entitled "Fast Photoconductive Detector Using P-$In_{0.53}Ga_{0.47}As$ with Response to 1.7 $\mu m$" appearing in Applied Physics Letters 38(1), 27(1981). A further demonstration of the suitability of Cr:GaAs switches with excitation at 0.53 microns and 1.06 microns and a 1 gigahertz repetition rate was shown by Chi H. Lee in his article entitled "Picosecond Optoelectronic Switching in GaAs", Applied Physics Letters 30(2), 84(1977). This same type switch actuated by a GaAs laser diode with a 100 ps pulse was tried and described by Robert A. Lawton and James R. Andrews in their article entitled "Optically Strobed Sampling Oscilloscope", IEEE Transactions on Instrumentation and Measurements, Vol. 25, No. 1, March 1976.

A somewhat similar structure in the form of an amorphous silicon switch shows fast response time, approximately 10 picoseconds rise time and approximately 15 picoseconds relaxation time. This capability also was demonstrated by D. H. Auston in the first article referred to above. Operation was disclosed in a mode where one light pulse "closes" the switch (0.53 microns) and another "opens" it (1.06 microns). Switching and gating of microwave signals with as much as 33 dB attenuation in the OFF state has been proven with one of these switches by A. M. Johnson and D. H. Auston in their article "Microwave Switching by Picosecond Photoconductivity", Journal of Quantum Electronics, Vol. QE11, No. 6 June 1975. Operation at a single wavelength was shown in the first Castagne publication identified above and D. H. Auston et al disclosed such operations in two articles entitled "An Amorphous Silicon Photodetector for Picosecond Pulses" and "Picosecond Optoelectronic Detection, Sampling, and Correlation Measurements in Amorphous Semiconductors" appearing in Applied Physics Letters 36(1)66 (1980) and Applied Physics Letters 37(4), 37(4), 371(1980), respectively. Auston and his associates demonstrated the generation and sampling of electronic transients with speeds on the order of 10 picoseconds and with a dark resistance of 5 megohms with similar devices.

Perhaps one of the most promising optically-controlled switches has been fabricated of iron-doped indium phosphide. Illuminated impedance is typically an order of magnitude below that of similar devices in chromium doped gallium arsenide, about 45 ohms for 40 pJ incident laser energy, and 70 picosecond wide pulses having a 30 picosecond rise time, have been generated at 900 megahertz. F. J. Leonberger and P. F. Moulton of the Lincoln Laboratory at Massachusetts Institute of Technology have shown a linear response at 0.53 microns over 1-12 milliwatts with leakage of 40 dB below the sampled signal level at 90% (0.2 dB) accuracy, (see "Development and Applications of High Speed InP Optoelectronic Switches", Applied Physics Letters 35(9), 712(1979). A further demonstration was made by Foit, Leonberger and Williamson of Lincoln Labs at MIT of an interdigital structure version of the switch operating at 100 megahertz as a mixer, see "InP Optoelectronic Mixers" SSPIE 269, 109 (Los Angeles, 2/81). Further work in this area has been shown by H. C. Tasey and E. Buehler of Bell Labs in their article entitled "Evidence for Low Surface Recombination Velocity on N-Type InP", Applied Physics Letter 30(5), 247(1977) and by scientists at the Los Alamos National Laboratory, see "Sub 100 ps Bulk-Recombination-Limited InP:Fe Photoconductive Detector" by R. B. Hammond et al, Int'l. Electronic Devices Meeting, Washington, D.C. Dec. 8-10(1981).

Sample switches, each of 2, 4 and 6 micron interdigital structure indium phosphide optoelectronic switches have been fabricated, note FIG. 3a. End-to-end electrode orientation, FIG. 3b, has provided different responses that may prove better for some applications; the interelectrode capacitance is reduced to affect the switch's impedances, for example.

The performance characteristics of an indium phosphide optoelectronic switch appears in FIG. 4. These parameters would make such a switch, when activated by light pulses through the fibers, suitable for sampling at high sampling rates. The electronically quiet, stable and highly synchronous sampling of all antennas of the array is inherent in the optoelectronic switches.

The analog digital converters 26a, 26b, ... 26n will have to be fast and have the capability of accurately representing the sampled signals. A number of conventional devices at each converter could be used with sequential samples being gated in sequence could be relied upon. The digital processing circuitry would be a wide variety of computer related apparatuses and functions.

Obviously many modifications and variations of the present invention are possible in the light of the above teachings. It is therefore to be understood that within the scope of the appended claims the invention may be practiced otherwise than as specifically described.

What is claimed is:

1. An apparatus for enabling the high speed synchronous sampling of signals from a plurality of signal sources comprising:
   means for providing light pulses at a rate equal to the high speed sampling;
   means disposed to receive the light pulses from the providing means for optically creating a series of actuating light pulses, each delayed in sequence from one another and each series starting from each light pulse from the providing means; and
   means operatively associated with the actuating light pulse creating means and connected to the signal sources for sampling each of the signal sources at the sampling rate and in the same synchronous sequence as the series of actuating pulses; and
   means coupled to the sampling means for converting the synchronous sequence of samples to digital signals to allow further processing.

2. An apparatus according to claim 1 in which the delayed series of actuating light pulse creating means provide for a plurality of light channel elements each connected to a separate signal source.

3. An apparatus according to claim 2 in which each light channel element is of a different length with respect to the other light channel elements to effect a discrete delay to its actuating pulse to assure synchronous sampling ot its interconnected signal source.

4. An apparatus according to claim 3 in which the signal source sampling means is a plurality of optoelectronic switches each coupled to a separate signal source and a separate light channel element.

5. An apparatus according to claim 3 in which each light channel element is an optical fiber and all the optical fibers are gathered in a bundle to receive the light pulses from the light pulse providing means and each optical fiber is coupled to a separate optoelectronic switch.

6. An apparatus according to claim 5 in which the light pulse providing means is a laser having a pulse repetition rate sufficient to assure the sampling of the signal sources at at least the Nyquist sampling rate.

7. An apparatus according to claim 6 in which the signal sources are high frequency between three and thirty megahertz directional receiving antennas.

8. An apparatus according to claim 7 in which the optoelectronic switches are chromium-doped gallium arsenide heterostructures having interdigital electrodes deposited thereon.

9. An apparatus according to claim 7 in which the optoelectronic switches are a p-type indium gallilum arsenide structure with electrodes having a fifteen micron gap.

10. An apparatus according to claim 7 in which the optoelectronic switches are amorphous silicon having electrodes deposited thereon.

11. An apparatus according to claim 7 in which the optoelectronic switches are iron doped indium phosphide structures having electrodes deposited thereon.

12. An apparatus according to claim 11 in which the electrodes are interdigital in form.

13. An apparatus according to claim 11 in which the electrodes are end-to-end in form.

14. An apparatus according to claim 2 including means for altering the light propogation rate associated with each light channel element.

* * * * *